United States Patent
Ebigase et al.

(10) Patent No.: US 7,161,284 B2
(45) Date of Patent: Jan. 9, 2007

(54) MULTILAYERED PIEZOELECTRIC/ELECTROSTRICTIVE DEVICE

(75) Inventors: Takashi Ebigase, Nagoya (JP); Hideki Shimizu, Oubu (JP)

(73) Assignee: NGK Insulators, Ltd., Nagoya (JP)

( * ) Notice: Subject to any disclaimer, the term of this patent is extended or adjusted under 35 U.S.C. 154(b) by 197 days.

(21) Appl. No.: 10/847,791

(22) Filed: May 18, 2004

(65) Prior Publication Data

US 2004/0232805 A1 Nov. 25, 2004

(30) Foreign Application Priority Data

May 21, 2003 (JP) .............................. 2003-143930

(51) Int. Cl.
*H01L 41/187* (2006.01)
*H01L 41/083* (2006.01)

(52) U.S. Cl. ..................................................... 310/358

(58) Field of Classification Search ................. 310/358
See application file for complete search history.

(56) References Cited

U.S. PATENT DOCUMENTS

| | | | |
|---|---|---|---|
| 6,107,121 A * | 8/2000 | Diffenderfer et al. ....... | 438/109 |
| 6,140,746 A * | 10/2000 | Miyashita et al. .......... | 310/358 |
| 6,565,997 B1 | 5/2003 | Kashiwaya ................. | 310/324 |
| 2003/0067251 A1 | 4/2003 | Kashiwaya et al. | |
| 2003/0072972 A1 | 4/2003 | Kashiwaya et al. | |
| 2004/0051422 A1 | 3/2004 | Kashiwaya et al. ......... | 428/701 |
| 2005/0111163 A1* | 5/2005 | Ito et al. ..................... | 361/311 |
| 2005/0191518 A1* | 9/2005 | Solberg ....................... | 428/687 |

FOREIGN PATENT DOCUMENTS

| | | | |
|---|---|---|---|
| EP | 0 794 579 | | 9/1997 |
| EP | 1 045 460 | | 10/2000 |
| EP | 1 321 986 | A2 | 6/2003 |
| EP | 1 321 987 | A2 | 6/2003 |
| JP | 42-20029 | | 10/1942 |
| JP | 44-17103 | | 7/1969 |
| JP | 45-8145 | | 3/1970 |
| JP | 50-3519 | | 2/1975 |
| JP | 60-102779 | | 6/1985 |
| JP | 64-018960 | * | 1/1989 |
| JP | 02-035785 | | 2/1990 |
| JP | 07-315926 | A1 | 12/1995 |

(Continued)

OTHER PUBLICATIONS

Hiromu Ouchi, Masamitsu Nishida, and Shigeru Hayakawa, *Piezoelectric Properties of Pb(Mg₁/₃Nb₂/₃)O₃-PbTiO₃-PbZrO₃ Ceramics Modified with Certain Additives*, Journal of The American Ceramic Society, vol. 49, No. 11, Nov. 21, 1966, pp. 577-582.

(Continued)

Primary Examiner—Thomas M. Dougherty
(74) Attorney, Agent, or Firm—Burr & Brown

(57) ABSTRACT

A multilayered piezoelectric/electrostrictive device is provided, including a substrate, a plurality of piezoelectric/electrostrictive portions, and a plurality of electrodes. The piezoelectric/electrostrictive portions and the electrodes are alternately layered on the substrate, and the piezoelectric/electrostrictive portion positioned in the lowermost layer is anchored to the substrate directly or through an electrode. The ratio ($\alpha=A/B$) of the average particle size (A) (μm) of the piezoelectric/electrostrictive ceramic of the piezoelectric/electrostrictive portion to the thickness (B) (μm) of the piezoelectric/electrostrictive portion satisfies the relationship expressed by "$0.02 \leq \alpha \leq 0.6$" in each of the piezoelectric/electrostrictive portions.

6 Claims, 6 Drawing Sheets

FOREIGN PATENT DOCUMENTS

| | | |
|---|---|---|
| JP | 9-223831 | 8/1997 |
| JP | 11-029357 | 2/1999 |
| JP | 2001-181033 | 7/2001 |
| JP | 2002-217464 | 8/2002 |
| JP | 2002-217465 | 8/2002 |
| JP | 2002-261341 | 9/2002 |

OTHER PUBLICATIONS

Uchino K et al: "Destruction Mechanism of Multilayer Ceramic Actuators", Proceedings of the 8$^{TH}$ IEEE International Symposium on Applications of Ferroelectrics (ISAF '92), Greenville, SC, USA Aug. 30-Sep. 2, 1992, New York, NY, USA IEEE, US, Aug. 30, 1992, pp. 195-198, XP010102776, ISBN: 0-7803-0465-9.

* cited by examiner

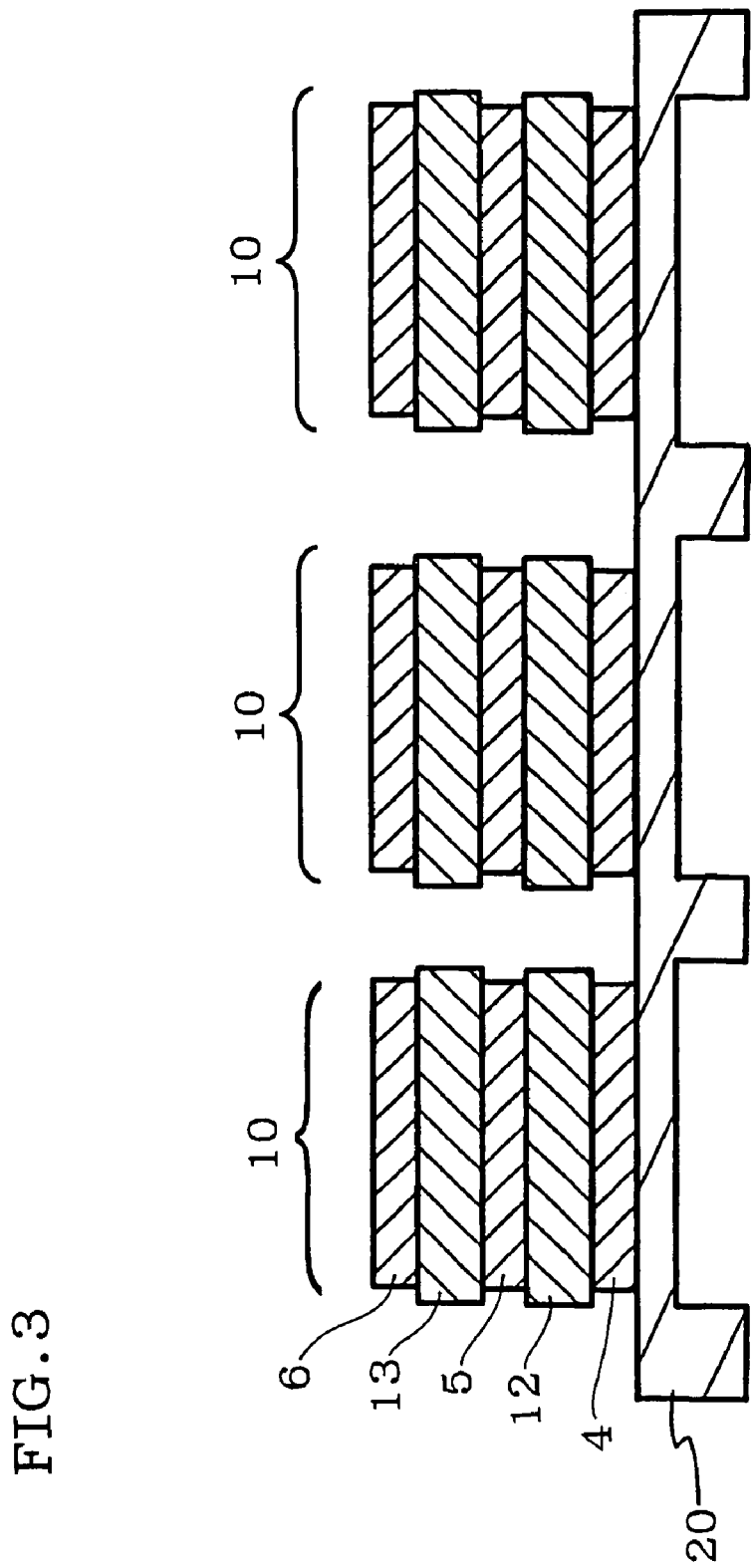

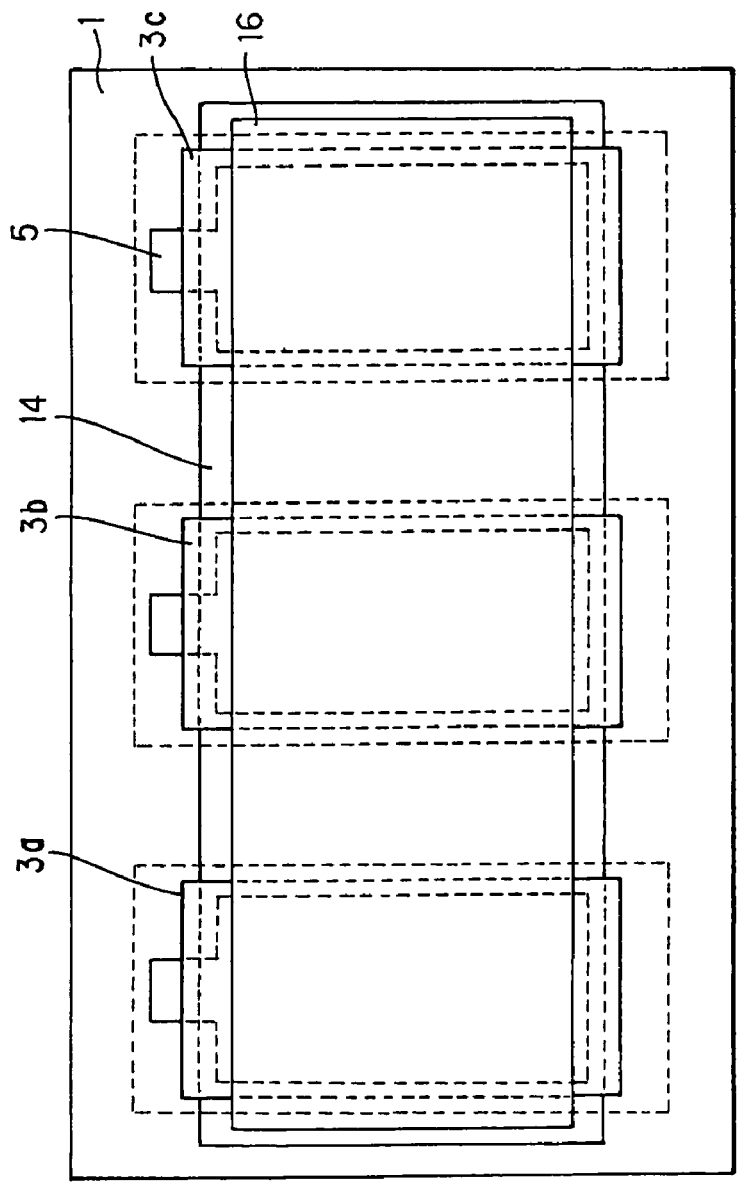
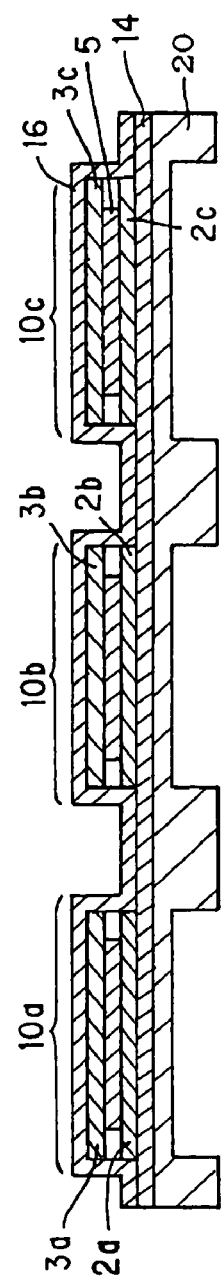
FIG.4(a)
FIG.4(b)

US 7,161,284 B2

MULTILAYERED PIEZOELECTRIC/ELECTROSTRICTIVE DEVICE

This application claims the benefit of Japanese Application 2003-143930, filed May 21, 2003, the entirety of which is incorporated herein by reference.

BACKGROUND OF THE INVENTION

1. Field of the Invention

The present invention relates to a multilayered piezoelectric/electrostrictive device. More particularly, the present invention relates to a multilayered piezoelectric/electrostrictive device which includes a piezoelectric/electrostrictive portion having extremely excellent piezoelectric/electrostrictive characteristics. This device offers excellent vibration transfer characteristics between the substrate and the piezoelectric/electrostrictive portion, exhibits little variation in the piezoelectric/electrostrictive characteristics even within the portions of a single piezoelectric/electrostrictive portion, and also exhibits excellent durability.

2. Description of Related Art

A piezoelectric/electrostrictive device is known to be able to control micro-displacement on the order of submicrons. A piezoelectric/electrostrictive device is generally used which includes a piezoelectric/electrostrictive portion formed of a piezoelectric/electrostrictive ceramic composition and having an electrode portion to which voltage is applied are layered on a ceramic substrate. In recent years, a multilayered piezoelectric/electrostrictive device in which a number of piezoelectric/electrostrictive portions and electrodes are alternately layered on the substrate are also used, since the output can be increased at a low applied voltage. The multilayered piezoelectric/electrostrictive device is suitable for controlling micro-displacement and has excellent characteristics such as high electrical/mechanical conversion efficiency, high-speed response, high durability, and small power consumption. Thus, the multilayered piezoelectric/electrostrictive device is used in various applications such as a piezoelectric pressure sensor, a probe moving mechanism for a scanning tunneling microscope, a linear guide mechanism for an ultra-precision machining device, a hydraulic pressure control servo valve, a head for a VTR device, a pixel for forming a flat panel image display device, or a head for an ink-jet printer.

Various studies have been made on the piezoelectric/electrostrictive ceramic composition used for forming the piezoelectric/electrostrictive portion. For example, a $Pb(Mg_{1/3}Nb_{2/3})O_3$—$PbTiO_3$—$PbZrO_3$ three-component solid solution composition or a piezoelectric/electrostrictive ceramic composition obtained by replacing a part of Pb in the composition with Sr or La is disclosed in JP-A-44-17103 and JP-A-45-8145, for example. It was expected that one may obtain a piezoelectric/electrostrictive device having excellent piezoelectric/electrostrictive characteristics (piezoelectric constant, for example) by using this composition to produce a piezoelectric/electrostrictive portion itself, which is the most important element which determines the piezoelectric/electrostrictive characteristics of the piezoelectric/electrostrictive device.

However, in case of the conventional piezoelectric/electrostrictive device, the piezoelectric/electrostrictive device is manufactured by performing a heat treatment after forming a piezoelectric/electrostrictive ceramic formed of the piezoelectric/electrostrictive ceramic composition on the substrate. Thus, contraction and densification of the piezoelectric/electrostrictive ceramic composition during the heat treatment are hindered because the substrate hardly contracts. Accordingly, the density of the piezoelectric/electrostrictive portion is decreased. As a result, problems arise, such as a decrease in the bending displacement or the occurrence of dielectric breakdown in the low density area when voltage is applied to the piezoelectric/electrostrictive portion. These problems become striking in a multilayered piezoelectric/electrostrictive device, and improvement is strongly demanded.

In view of the above-described situation, JP-A-11-29357 proposed that the densification of a piezoelectric/electrostrictive portion is attained by mounting a piezoelectric/electrostrictive portion obtained by heating a piezoelectric/electrostrictive ceramic to the substrate when the piezoelectric/electrostrictive ceramic is formed of a piezoelectric/electrostrictive ceramic composition that has been heated in advance. In this case, it is necessary to use an inorganic or organic adhesive when the piezoelectric/electrostrictive portion is mounted to the substrate. The adhesive, however, hinders the vibration transfer between the substrate and the piezoelectric/electrostrictive portion, or the adhesive component can deteriorate the characteristics of the piezoelectric/electrostrictive portion or the substrate.

In the case where variations in the piezoelectric/electrostrictive characteristics occur between the piezoelectric/electrostrictive portions or between portions (center and end, for example) within a single piezoelectric/electrostrictive portion of the piezoelectric/electrostrictive device including such a piezoelectric/electrostrictive portion is provided in an electronic instrument such as a transmitter or a sensor, it is difficult to provide the desired characteristics, and excellent transmission or accurate sensing can be hardly attained. Moreover, a piezoelectric/electrostrictive device having variations in the piezoelectric/electrostrictive characteristics between portions within a single piezoelectric/electrostrictive portion may pose a problem relating to durability due to stress concentrations caused by variations in the bending displacement.

In order to solve the above-described problems, a piezoelectric device including a piezoelectric portion formed of a piezoelectric ceramic composition containing a specific $Pb(Mg,Ni)_{1/3}Nb_{2/3}O_3$—$PbZrO_3$—$PbTiO_3$ three-component solid solution composition, in which a part of the Mg is replaced with Ni, as an essential component is disclosed in JP-A-2001-388315, for example. However, the piezoelectric device disclosed in JP-A-2001-388315 does not fully eliminate variations in the piezoelectric/electrostrictive characteristics between the piezoelectric/electrostrictive portions or between different portions (center and end, for example) of a single piezoelectric/electrostrictive portion. Moreover, further improvements in durability are strongly demanded.

SUMMARY OF THE INVENTION

The present invention has been made in view of the above-described problems in the conventional art. Therefore, an object of the present invention is to provide a multilayered piezoelectric/electrostrictive device which includes a piezoelectric/electrostrictive portion having extremely excellent piezoelectric/electrostrictive characteristics, such as excellent vibration transfer characteristics between the substrate and the piezoelectric/electrostrictive portion, little variation in the piezoelectric/electrostrictive characteristics between piezoelectric/electrostrictive portions or between different portions of a single piezoelectric/electrostrictive portion, and excellent durability.

According to the present invention, a multilayered piezoelectric/electrostrictive device is provided, comprising a ceramic substrate, a plurality of piezoelectric/electrostrictive portions including a piezoelectric/electrostrictive ceramic formed of a piezoelectric/electrostrictive ceramic composition, and a plurality of electrodes electrically connected with the piezoelectric/electrostrictive portions. The piezoelectric/electrostrictive portions and the electrodes are alternately layered on the substrate. A lowermost piezoelectric/electrostrictive portion of the piezoelectric/electrostrictive portions positioned in a lowermost layer is adhered to the substrate directly or through a lowermost electrode of the electrodes positioned in a lowermost layer. A ratio ($\alpha$=A/B) of an average particle size (A) (μm) of the piezoelectric/electrostrictive ceramic used for forming the piezoelectric/electrostrictive portion to a thickness (B) (μm) of the piezoelectric/electrostrictive portion satisfies a relationship expressed by "$0.02 \leq \alpha \leq 0.6$" in each of the piezoelectric/electrostrictive portions.

In the present invention, it is preferable that the maximum particle size (μm) of the piezoelectric/electrostrictive ceramic used for forming the piezoelectric/electrostrictive portions is smaller than the thickness (μm) of the piezoelectric/electrostrictive portion in each of the piezoelectric/electrostrictive portions.

In the present invention, it is preferable that the Ni content (NiO conversion) in the piezoelectric/electrostrictive ceramic composition used for forming the lowermost piezoelectric/electrostrictive portion is in a range of 0.06–0.84 mass %, and that the Ni content in terms of NiO in the piezoelectric/electrostrictive ceramic composition used for forming each of the piezoelectric/electrostrictive portions in layers other than the lowermost piezoelectric/electrostrictive portion is greater than or equal to the Ni content in terms of NiO in the piezoelectric/electrostrictive ceramic composition used for forming the lowermost piezoelectric/electrostrictive portion.

In the present invention, it is preferable that the thickness of the piezoelectric/electrostrictive portions is in a range of 1–50 μm. In the present invention, it is also preferable that the piezoelectric/electrostrictive ceramic composition includes an essential component comprising a $Pb(Mg,Ni)_{1/3}Nb_{2/3}O_3$—$PbZrO_3$—$PbTiO_3$ three-component solid solution composition represented by formula (1).

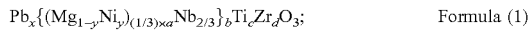  Formula (1)

wherein $0.95 \leq x \leq 1.05$, $0.05 \leq y \leq 0.50$, $0.90 \leq a \leq 1.10$, and wherein each of b, c, and d is a decimal within the range enclosed by coordinates in which b, c, and d are axes of coordinates, (b, c, d)=(0.550, 0.425, 0.025), (0.550, 0.325, 0.125), (0.375, 0.325, 0.300), (0.100, 0.425, 0.475), (0.100, 0.475, 0.425), and (0.375, 0.425, 0.200), provided that (b+c+d)=1.000.

In the present invention, it is preferable that the piezoelectric/electrostrictive ceramic composition used for forming the lowermost piezoelectric/electrostrictive portion includes an essential component comprising a $Pb(Mg,Ni)_{1/3}Nb_{2/3}O_3$—$PbZrO_3$—$PbTiO_3$ three-component solid solution composition represented by formula (2), and it is preferable that the piezoelectric/electrostrictive ceramic composition used for forming the piezoelectric/electrostrictive portions above the lowermost piezoelectric/electrostrictive portion includes NiO and an essential component comprising a $PbMg_{1/3}Nb_{2/3}O_3$—$PbZrO_3$—$PbTiO$ three-component solid solution composition represented by formula (3).

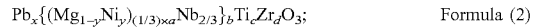  Formula (2)

wherein $0.95 \leq x \leq 1.05$, $0.05 \leq y \leq 0.50$, $0.90 \leq a \leq 1.10$, and wherein each of b, c, and d is a decimal within the range enclosed by coordinates in which b, c, and d are axes of coordinates, (b, c, d)=(b, c, d)=(0.550, 0.425, 0.025), (0.550, 0.325, 0.125), (0.375, 0.325, 0.300), (0.100, 0.425, 0.475), (0.100, 0.475, 0.425), and (0.375, 0.425, 0.200), provided that (b+c+d)=1.000.

  Formula (3)

wherein $0.95 \leq x \leq 1.05$, $0.95 \leq y \leq 1.050$, and wherein each of b, c, and d is a decimal within the range enclosed by coordinates in which b, c, and d are axes of coordinates, (b, c, d)=(a, b, c)=(0.550, 0.425, 0.025), (0.550, 0.325, 0.125), (0.375, 0.325, 0.300), (0.100, 0.425, 0.475), (0.100, 0.475, 0.425), and (0.375, 0.425, 0.200), provided that (a+b+c)=1.000.

BRIEF DESCRIPTION OF THE DRAWINGS

FIG. 3 is a cross-sectional view schematically showing another embodiment of a multilayered piezoelectric/electrostrictive device according to the present invention.

FIGS. 4(a) and 4(b) schematically show another embodiment of a multilayered piezoelectric/electrostrictive device according to the present invention, wherein FIG. 4(a) is a top view and FIG. 4(b) is a cross-sectional view.

FIGS. 5(a)–5(c) schematically show another embodiment of a multilayered piezoelectric/electrostrictive device according to the present invention, wherein FIG. 5(a) is a top view, FIG. 5(b) is a cross-sectional view taken along line A–A' in FIG. 5(a), and FIG. 5(c) is a cross-sectional view taken along line B–B' in FIG. 5(a).

DETAILED DESCRIPTION OF THE INVENTION

While embodiments of the present invention are described below, the present invention is not limited to the following embodiments. Various modifications and improvements of the design can be made within the scope of the present invention based on the knowledge of a person skilled in the art. A multilayered piezoelectric/electrostrictive device including two layers of piezoelectric/electrostrictive portions is mainly described below as an example. However, a multilayered piezoelectric/electrostrictive device including three or more layers of piezoelectric/electrostrictive portions is also included within the scope of the present invention.

Figure 1:
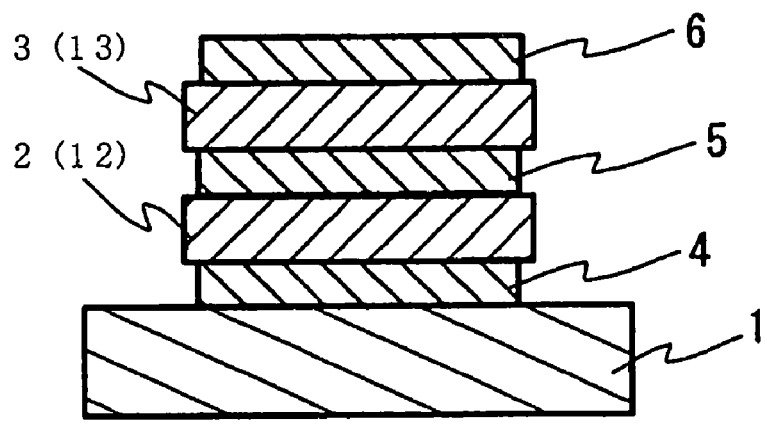
FIG. 1 is a cross-sectional view schematically showing an embodiment of a multilayered piezoelectric/electrostrictive device according to the present invention.

As shown in FIG. 1, a multilayered piezoelectric/electrostrictive device according to one embodiment of the present invention includes, a ceramic substrate 1, piezoelectric/electrostrictive portions 2 (first piezoelectric/electrostrictive portion 12) and 3 (second piezoelectric/electrostrictive portion 13) including a piezoelectric/electrostrictive ceramic formed of a piezoelectric/electrostrictive ceramic composition, and electrodes 4 and 5 electrically connected with the piezoelectric/electrostrictive portions 2 and 3. FIG. 1 shows a state in which the piezoelectric/electrostrictive portions 2 and 3 and the electrodes 4 and 5 are alternately layered on the substrate 1, and the lowermost piezoelectric/electrostrictive portion (first piezoelectric/electrostrictive portion 12) of the piezoelectric/electrostrictive portions 2 and 3 positioned in the lowermost layer adheres to the substrate 1 through the lowermost electrode (electrode 4) positioned in the lowermost layer.

In the present invention, the first piezoelectric/electrostrictive portion which is the lowermost piezoelectric/electrostrictive portion may also be directly adhered to the substrate without the electrode being interposed therebetween. Each anchoring state can prevent a decrease in the vibration transfer characteristics between the substrate and the piezoelectric/electrostrictive portion caused by the presence of an adhesive or the like, and prevent the deterioration of the characteristics of the piezoelectric/electrostrictive portion or the substrate caused by the effects of an adhesive component or the like. The term "anchoring" used herein means a state in which the piezoelectric/electrostrictive portion and the substrate are closely integrated without using an organic or inorganic adhesive due to a solid phase reaction between the piezoelectric/electrostrictive portion and the substrate or the electrode.

In the multilayered piezoelectric/electrostrictive device of the present embodiment, the thickness of the piezoelectric/electrostrictive portions 2 and 3 is denoted by B (µm) and the average particle size of the piezoelectric/electrostrictive ceramic used for forming the piezoelectric/electrostrictive portions 2 and 3 is denoted by A (µm), such that the ratio $\alpha = A/B$ satisfies a relationship expressed by "$0.02 \leq \alpha \leq 0.6$" in each of the piezoelectric/electrostrictive portions 2 and 3. In the present specification, the term "ratio $\alpha$" herein after means a ratio between the average particle size A (µm) of the piezoelectric/electrostrictive ceramic used for forming a piezoelectric/electrostrictive portion and the thickness B (µm) of the piezoelectric/electrostrictive portion. In other words, the particle size of the piezoelectric/electrostrictive ceramic used for a specified single piezoelectric/electrostrictive portion is preferably within a predetermined range with respect to the thickness of that specified single piezoelectric/electrostrictive portion. Therefore, since variations in the piezoelectric/electrostrictive characteristics in each of the piezoelectric/electrostrictive portions 2 and 3 are small, the multilayered piezoelectric/electrostrictive device of the present embodiment is suitable as a piezoelectric/electrostrictive device to be disposed in an electronic instrument such as a transmitter or a sensor for which excellent transmission or accurate sensing is required. Moreover, since variations in the piezoelectric/electrostrictive characteristics in each of the piezoelectric/electrostrictive portions 2 and 3 are small, stress concentrations caused by variations in the bending displacement can also be prevented. Therefore, since the multilayered piezoelectric/electrostrictive device of the present embodiment rarely poses problems such as significant decreases in the piezoelectric/electrostrictive characteristics or stress fracture during use over a long time, the multilayered piezoelectric/electrostrictive device of the present embodiment exhibits excellent durability.

If the ratio $\alpha$ exceeds 0.6, variations in the piezoelectric/electrostrictive characteristics in the device increase. If the ratio $\alpha$ is below 0.02, the piezoelectric/electrostrictive characteristics gradually decrease, whereby it may be difficult to secure sufficient displacement. In the multilayered piezoelectric/electrostrictive device of the present invention, the ratio $\alpha$ preferably satisfies the relationship expressed by "$0.2 \leq \alpha \leq 0.4$" in each piezoelectric/electrostrictive portion from the viewpoint of further reducing variations in the piezoelectric/electrostrictive characteristics in each piezoelectric/electrostrictive portion and to further provide excellent durability.

In the multilayered piezoelectric/electrostrictive device of the present invention, the maximum particle size (µm) of the piezoelectric/electrostrictive ceramic used for forming the piezoelectric/electrostrictive portions 2 and 3 is preferably smaller than the thickness (µm) of the piezoelectric/electrostrictive portion in each of the piezoelectric/electrostrictive portions 2 and 3. If the maximum particle size (µm) is greater than the thickness (µm) of the piezoelectric/electrostrictive portion, a piezoelectric/electrostrictive ceramic having a considerably large particle size may not be included in any one of the piezoelectric/electrostrictive portions, even if the thickness (B) of the piezoelectric/electrostrictive portion and the average particle size (A) of the piezoelectric/electrostrictive ceramic can satisfy the relationship shown by the ratio $\alpha$ specified above. This is because the presence of particles having such a large size would cause variations in the piezoelectric/electrostrictive characteristics of the piezoelectric/electrostrictive portion.

In the multilayered piezoelectric/electrostrictive device of the present invention, it is preferable that the Ni content in the piezoelectric/electrostrictive ceramic composition used for forming the lowermost piezoelectric/electrostrictive portion (first piezoelectric/electrostrictive portion 12) is in a range of 0.06–0.84 mass %, and that the Ni content in the piezoelectric/electrostrictive ceramic composition used for forming each of the piezoelectric/electrostrictive portions (second piezoelectric/electrostrictive portion 13 in FIG. 1) positioned above the first piezoelectric/electrostrictive portion 12 is greater than or equal to the Ni content in the piezoelectric/electrostrictive ceramic composition used for forming the first piezoelectric/electrostrictive portion 12. If the piezoelectric/electrostrictive ceramic composition contains Ni in the above predetermined content, the formation of a heterophase is prevented in the first piezoelectric/electrostrictive portion 12 and the proportion of the perovskite phase which contributes to bending displacement is increased, so that the piezoelectric/electrostrictive characteristics can be improved by the characteristics of the composition. Moreover, the piezoelectric/electrostrictive portion (second piezoelectric/electrostrictive portion 13) having a higher Ni content and positioned in the layer above the first piezoelectric/electrostrictive portion 12 is only restricted by the substrate 1 to a small extent with respect to sintering shrinkage, so that the effect of the addition of Ni becomes significant. Therefore, the piezoelectric/electrostrictive portion (second piezoelectric/electrostrictive portion 13) positioned above the first piezoelectric/electrostrictive portion 12 is highly densified by during heat treatment in the manufacturing step, and the adjacent first piezoelectric/electrostrictive portion 12 is also densified by the effect of the second piezoelectric/electrostrictive portion 13. Therefore, the multilayered piezoelectric/electrostrictive device of the present embodiment has higher piezoelectric/electrostrictive characteristics in combination with the characteristics of the piezoelectric/electrostrictive ceramic composition.

In the multilayered piezoelectric/electrostrictive device of the present embodiment, the Ni content in the piezoelectric/electrostrictive ceramic composition used for forming the first piezoelectric/electrostrictive portion 12 is still more preferably in a range of 0.15–0.8 mass %, and particularly preferably in a range of 0.18–0.25 mass % from the viewpoint of further densifying the first piezoelectric/electrostrictive portion 12 in addition to preventing the formation of a heterophase in the piezoelectric/electrostrictive portion.

In the multilayered piezoelectric/electrostrictive device of the present embodiment, the Ni content ratio (first/second) (mass % (NiO conversion)) in the piezoelectric/electrostrictive ceramic composition used for forming the first piezoelectric/electrostrictive portion 12 to the Ni content in mass % in the piezoelectric/electrostrictive ceramic composition used for forming the second piezoelectric/electrostrictive portion 13 is preferably in a range of 0.2–1.0, more preferably in a range of 0.3–1.0, and particularly preferably in a range of 0.5–1.0. If the Ni content ratio (first/second) is below 0.2, the particle size of the piezoelectric/electrostrictive ceramic used for forming the first piezoelectric/electrostrictive portion and the second piezoelectric/electrostrictive portion increases, whereby the overall piezoelectric/electrostrictive characteristics decrease. That is, variations in the bending displacement in the piezoelectric/electrostrictive device increase. If the Ni content ratio exceeds 1.0, the particle size of the piezoelectric/electrostrictive ceramic used for forming the first piezoelectric/electrostrictive portion and the second piezoelectric/electrostrictive portion decreases, whereby the overall piezoelectric/electrostrictive characteristics decrease. That is, the bending displacement of the piezoelectric/electrostrictive device also decreases.

In the multilayered piezoelectric/electrostrictive device of the present invention, the thickness of one of the piezoelectric/electrostrictive portions (the first piezoelectric/electrostrictive portion 12 or the second piezoelectric/electrostrictive portion 13 in FIG. 1) is preferably in a range of 1–50 µm, more preferably in a range of 2–40 µm, and particularly preferably in a range of 3–30 µm. If the thickness of the piezoelectric/electrostrictive portion is below 1 µm, densification of the piezoelectric/electrostrictive portions tends to become insufficient even if the piezoelectric/electrostrictive portions are made of a piezoelectric/electrostrictive ceramic composition containing Ni in the above predetermined content. If the thickness of the piezoelectric/electrostrictive portion exceeds 50 µm, since it is necessary to increase the thickness of the substrate in order to prevent breakage of the substrate, it is difficult to effectively reduce the size of the piezoelectric/electrostrictive device.

The piezoelectric/electrostrictive ceramic composition used for forming the piezoelectric/electrostrictive portion of the multilayered piezoelectric/electrostrictive device according to the present invention preferably comprises a $Pb(Mg,Ni)_{1/3}Nb_{2/3}O_3$—$PbZrO_3$—$PbTiO_3$ three-component solid solution composition represented by formula (1) as an essential component. Since this three-component solid solution composition is prepared by replacing a part of Mg in a $Pb(Mg_{1/3}Nb_{2/3})O_3$—$PbTiO_3$—$PbZrO_3$ three-component solid solution composition with Ni, the formation of a heterophase in the piezoelectric/electrostrictive portion is prevented and the proportion of the perovskite phase which contributes to bending displacement is increased, whereby the piezoelectric/electrostrictive characteristics are improved by the characteristics of the composition.

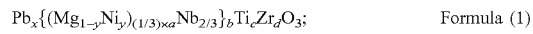

$$Pb_x\{(Mg_{1-y}Ni_y)_{(1/3)\times a}Nb_{2/3}\}_b Ti_c Zr_d O_3; \quad \text{Formula (1)}$$

wherein $0.95 \leq x \leq 1.05$, $0.05 \leq y \leq 0.50$, $0.90 \leq a \leq 1.10$, and wherein each of b, c, and d is a decimal within the range enclosed by coordinates in which b, c, and d are axes of coordinates, (b, c, d)=(0.550, 0.425, 0.025), (0.550, 0.325, 0.125), (0.375, 0.325, 0.300), (0.100, 0.425, 0.475), (0.100, 0.475, 0.425), and (0.375, 0.425, 0.200), provided that (b+c+d)=1.000.

The piezoelectric/electrostrictive ceramic composition used for forming the lowermost piezoelectric/electrostrictive portion of the multilayered piezoelectric/electrostrictive device of the present invention preferably comprises a $Pb(Mg,Ni)_{1/3}Nb_{2/3}O_3$—$PbZrO_3$—$PbTiO_3$ three-component solid solution composition represented by formula (2) as an essential component, and the piezoelectric/electrostrictive ceramic composition used for forming the piezoelectric/electrostrictive portion positioned above the lowermost piezoelectric/electrostrictive portion preferably includes NiO and comprises a $PbMg_{1/3}Nb_{2/3}O_3$—$PbZrO_3$—$PbTiO$ three-component solid solution composition shown by the following formula (3) as an essential component.

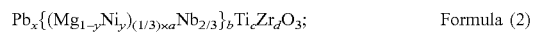

$$Pb_x\{(Mg_{1-y}Ni_y)_{(1/3)\times a}Nb_{2/3}\}_b Ti_c Zr_d O_3; \quad \text{Formula (2)}$$

wherein $0.95 \leq x \leq 1.05$, $0.05 \leq y \leq 0.50$, $0.90 \leq a \leq 1.10$, and wherein each of b, c, and d is a decimal within the range enclosed by coordinates in which b, c, and d are axes of coordinates, (b, c, d)=(0.550, 0.425, 0.025), (0.550, 0.325, 0.125), (0.375, 0.325, 0.300), (0.100, 0.425, 0.475), (0.100, 0.475, 0.425), and (0.375, 0.425, 0.200), provided that (b+c+d)=1.000.

$$Pb_x(Mg_{y/3}Nb_{2/3})_a Ti_b Zr_c O_3; \quad \text{Formula (3)}$$

wherein $0.95 \leq x \leq 1.05$, $0.95 \leq y \leq 1.050$, and wherein each of b, c, and d is a decimal within the range enclosed by coordinates in which b, c, and d are axes of coordinates, (a, b, c)=(0.550, 0.425, 0.025), (0.550, 0.325, 0.125), (0.375, 0.325, 0.300), (0.100, 0.425, 0.475), (0.100, 0.475, 0.425), and (0.375, 0.425, 0.200), provided that (a+b+c)=1.000.

Specifically, the formation of a heterophase in the piezoelectric/electrostrictive portion is prevented and the proportion of the perovskite phase which contributes to bending displacement is increased, whereby the piezoelectric/electrostrictive characteristics are improved by the characteristics of the composition. Moreover, since a reduction of the Pb content of the perovskite structure is prevented in the piezoelectric/electrostrictive portion positioned above the lowermost piezoelectric/electrostrictive portion, the bending displacement of the piezoelectric/electrostrictive portion positioned in the upper layer is extremely increased, whereby the piezoelectric/electrostrictive characteristics are improved over the entire multilayered piezoelectric/electrostrictive device.

The substrate used for forming the multilayered piezoelectric/electrostrictive device of the present invention is formed of a ceramic. There are no specific limitations as to the type of the ceramic. The substrate is preferably formed of a ceramic which includes at least one material selected from the group consisting of stabilized zirconium oxide, aluminum oxide, magnesium oxide, mullite, aluminum nitride, silicon nitride, and glass from the viewpoint of heat resistance, chemical stability, and insulating properties. The substrate is more preferably formed of stabilized zirconium oxide, since stabilized zirconium oxide has high mechanical strength and excellent toughness. The term "stabilized zirconium oxide" used herein refers to zirconium oxide in which the crystal phase transition is controlled by adding a stabilizer, and includes partially stabilized zirconium oxide in addition to stabilized zirconium oxide.

Examples of stabilized zirconium oxide include stabilized zirconium oxide containing a stabilizer such as calcium oxide, magnesium oxide, yttrium oxide, scandium oxide, ytterbium oxide, cerium oxide, or an oxide of a rare earth metal in an amount of 1–30 mol %. Of these, stabilized zirconium oxide containing yttrium oxide as the stabilizer is preferred, since the mechanical strength of the vibration portion is particularly increased. In this case, yttrium oxide is preferably added in an amount of 1.5–6 mol %, and more preferably in an amount of 2–4 mol %. It is preferable to use stabilized zirconium oxide further containing aluminum oxide in an amount of 0.1–5 mol %. The crystal phase of the stabilized zirconium oxide may be a mixed phase of a cubic phase and a monoclinic phase, a mixed phase of a tetragonal phase and a monoclinic phase, a mixed phase of a cubic phase, a tetragonal phase, and a monoclinic phase, or the like. The main crystal phase of the stabilized zirconium oxide is preferably a tetragonal phase or a mixed phase of a tetragonal phase and a cubic phase from the viewpoint of increasing the strength, toughness, and durability.

The thickness of the substrate is preferably in a range of 1 μm to 1 mm, more preferably in a range of 1.5–500 μm, and particularly preferably 2–200 μm. If the thickness of the substrate is less than 1 μm, the mechanical strength of the multilayered piezoelectric/electrostrictive device may decrease. If the thickness of the substrate is greater than 1 mm, the rigidity of the substrate against the shrinkage stress of the piezoelectric/electrostrictive portion increases when voltage is applied, whereby the bending displacement of the multilayered piezoelectric/electrostrictive device decreases.

Figure 2:
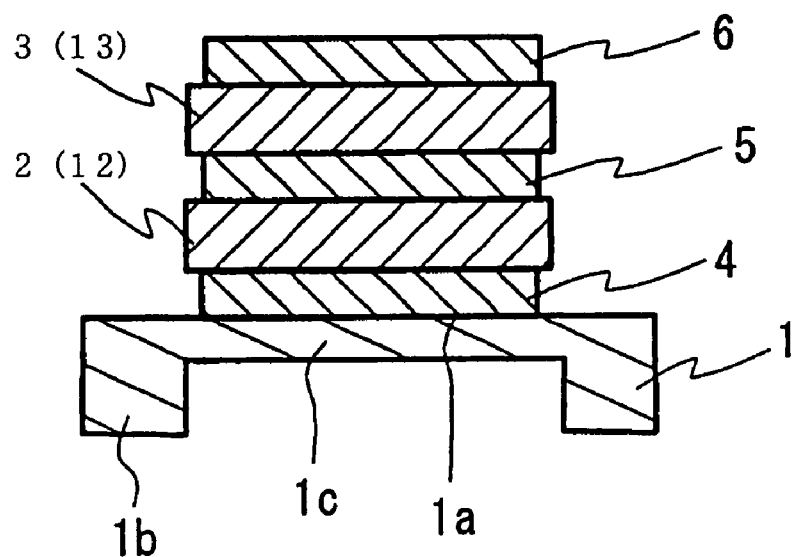
FIG. 2 is a cross-sectional view schematically showing another embodiment of a multilayered piezoelectric/electrostrictive device according to the present invention.

As shown in FIG. 2, the substrate 1 may be formed such that the shape of the substrate 1 includes a thin portion 1c which includes at least one anchoring surface 1a to which the piezoelectric/electrostrictive portion 2 or the electrode 4 is anchored (FIG. 2 shows an example in which the electrode 4 is anchored to the substrate 1), and which has the above predetermined thickness (thickness of the substrate). The substrate 1 also has a thick portion 1b which is continuous with the thin portion 1c and which has a greater thickness than the thickness of the thin portion 1c. The bending displacement and mechanical strength of the multilayered piezoelectric/electrostrictive device can be increased by forming the substrate 1 in such a shape. As shown in FIG. 3, a plurality of structural units may be formed on a common substrate 20, and the common substrate 20 may be used in common by a plurality of piezoelectric/electrostrictive devices 10.

Figure 5A:
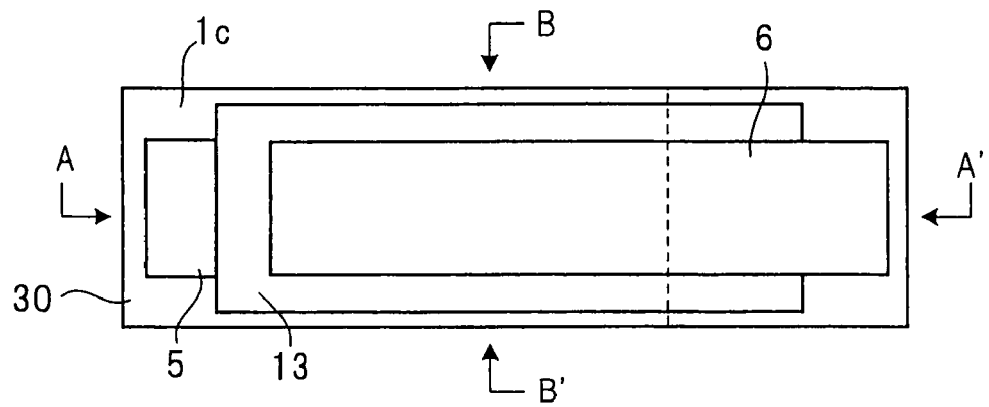
Figure 5B:
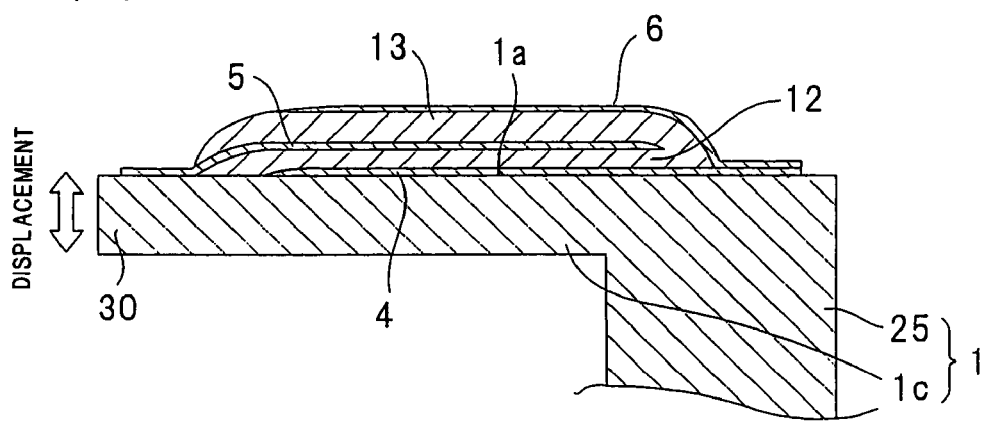
Figure 5C:
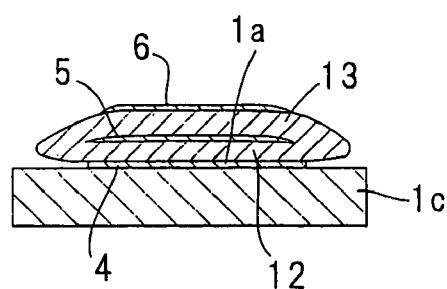

In the embodiment of the multilayered piezoelectric/electrostrictive device of the present invention shown in FIGS. 5(a)–5(c), the substrate 1 is formed in such that the shape of the substrate 1 includes a sheet-shaped thin portion 1c which includes at least one anchoring surface 1a to which the piezoelectric/electrostrictive portion 2 (or electrode 4) is anchored and which has the above predetermined thickness (thickness of the substrate). The substrate also includes a support portion 25 which is continuous with one end of the thin portion 1c, and the electrodes 4, 5, and 6 and the piezoelectric/electrostrictive portions (first piezoelectric/electrostrictive portion 12 and second piezoelectric/electrostrictive portion 13) are alternately layered on the anchoring surface 1a. In this case, the other end of the thin portion 1c becomes an actuator portion 30 which is displaced in a predetermined direction (vertical direction in FIG. 5(b)) based on the bending displacement of the piezoelectric/electrostrictive portions (first piezoelectric/electrostrictive portion 12 and second piezoelectric/electrostrictive portion 13). Since the multilayered piezoelectric/electrostrictive device of the present embodiment exhibits accurate frequency characteristics due to extremely small variations in the piezoelectric/electrostrictive characteristics between each portion of the piezoelectric/electrostrictive portion, accurate sensing can be performed by the actuator portion 30. Therefore, in the case where the multilayered piezoelectric/electrostrictive device of the present embodiment is provided in an electronic instrument such as a transmitter or a sensor, excellent transmission and accurate sensing can be easily achieved.

There are no specific limitations as to the surface shape of the substrate in the present invention (shape of the surface to which the electrode 4 adheres in FIG. 1). For example, the surface shape of the substrate may be a rectangle, square, triangle, ellipse, circle, rounded square, rounded rectangle, or complex shape of these. There are also no specific limitations as to the shape of the substrate, which may have a capsule shape with an appropriate internal space.

Figure 7:
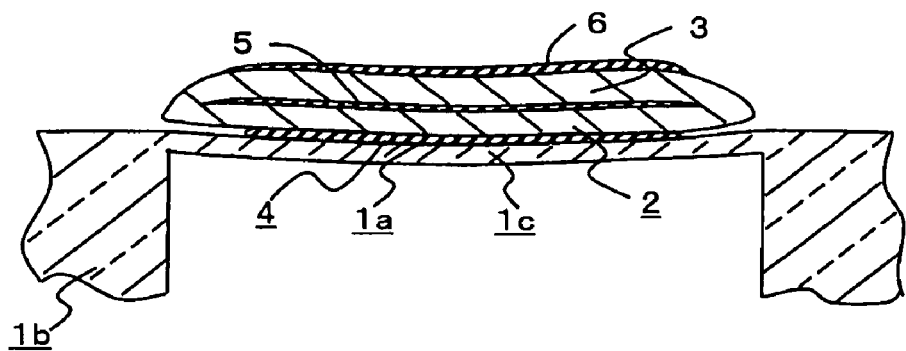
FIG. 7 is a cross-sectional view showing another detailed example of the embodiment shown in FIG. 2.
Figure 8:
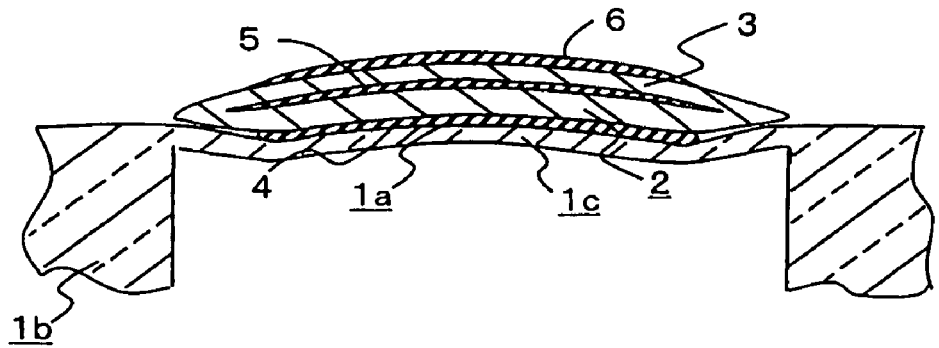
FIG. 8 is a cross-sectional view showing another detailed example of the embodiment shown in FIG. 2.

The thin portion of the substrate preferably has a shape in which the center is bent in the direction opposite to the surface having the piezoelectric/electrostrictive portions 2 and 3 as shown in FIG. 7, or a "W" shape in which the cross-sectional shape in the direction of the thickness has three inflection points as shown in FIG. 8. The bending shape shown in FIG. 7 may be formed by utilizing shrinkage of the piezoelectric/electrostrictive portions 2 and 3 in a heat treatment step, and the "W" shape shown in FIG. 8 may be formed by adjusting the sintering shrinkage start timing or the amount of sintering shrinkage of the piezoelectric/electrostrictive portion 2 and the piezoelectric/electrostrictive portion 3, or by adjusting the shape of the thin portion 1c.

In the present invention, the electrode is electrically connected with the piezoelectric/electrostrictive portion, and is disposed between the piezoelectric/electrostrictive portions. If the electrode is disposed in this manner, in the case where the Ni content in the piezoelectric/electrostrictive ceramic composition used for forming the piezoelectric/electrostrictive portion positioned above the lowermost piezoelectric/electrostrictive portion is greater than or equal to the Ni content in the piezoelectric/electrostrictive ceramic composition used for forming the lowermost piezoelectric/electrostrictive portion, the electrode functions as an Ni barrier, whereby Ni can effectively be prevented from transitioning to the lowermost piezoelectric/electrostrictive portion having a lower Ni content from the other piezoelectric/electrostrictive portion which has a higher Ni content and forming a heterophase in the portion thereof.

Therefore, in the present invention, the electrode is preferably disposed in a state in which the electrode includes a region of the piezoelectric/electrostrictive portion which contributes to bending displacement or the like. For example, it is preferable that the electrodes 4, 5, and 6 are disposed in the region including near the center of 80 area % or more of the formation surface of the first piezoelectric/electrostrictive portion 12 and the second piezoelectric/electrostrictive portion 13 as shown in FIG. 1.

As shown in FIGS. 4(a) and 4(b), in the case where a common substrate 20 is used in common by a plurality of piezoelectric/electrostrictive devices 10a to 10c, the lowermost electrode 14 and the uppermost electrode 16 of the piezoelectric/electrostrictive devices 10a, 10b and 10c may be used in common by the piezoelectric/electrostrictive devices 10a to 10c, and may be disposed as an integral electrode 14 in the region corresponding to piezoelectric/electrostrictive portions 2a, 2b and 2c, and 3a, 3b and 3c. Since such an integral electrode 14 need not have a shape corresponding to each of the piezoelectric/electrostrictive portions 2a to 2c and 3a to 3c, alignment is facilitated when forming the electrode.

In the present invention, at least one metal selected from the group consisting of platinum, palladium, rhodium, gold, silver, and an alloy of these metals can be used as the raw material for the electrode. Of these, it is preferable to use platinum or an alloy containing platinum as a major component, since high heat resistance is secured during the heat treatment of the piezoelectric/electrostrictive portion.

Figure 6:
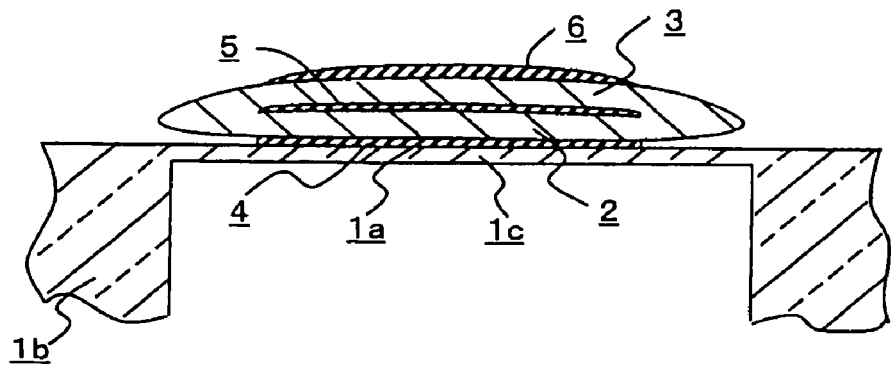
FIG. 6 is a cross-sectional view showing a more detailed example of the embodiment shown in FIG. 2.
Figure 9:
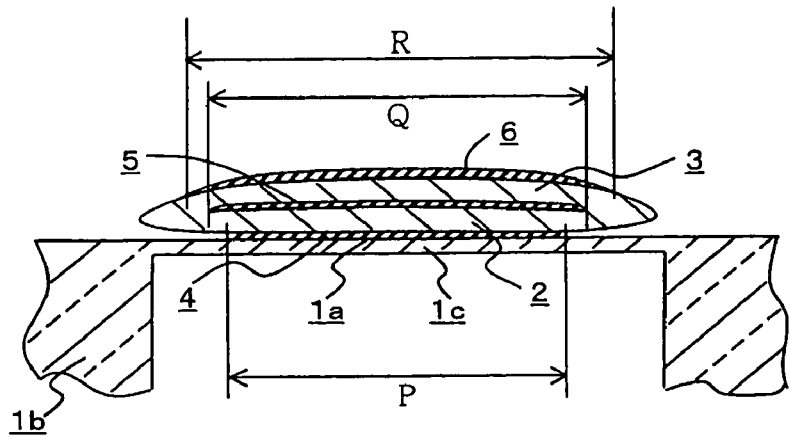
FIG. 9 is a cross-sectional view showing another detailed example of the embodiment shown in FIG. 2.

There are no specific limitations as to the dimensions of the electrode. As shown in FIG. 6, the electrodes 4, 5, and 6 may have the same dimensions and may be provided at corresponding positions in the same range in the direction of the thickness. As shown in FIG. 9, it is also preferable that the electrodes 4, 5, and 6 are formed in a larger range including a range corresponding to the electrode positioned in the lower layer in order from the electrode 4. This configuration enables the piezoelectric/electrostrictive portion positioned in the upper layer to be distorted to a greater extent than the piezoelectric/electrostrictive portion positioned in the lower layer, whereby the bending displacement can occur more effectively due to an increase in the bending efficiency.

Figure 10:
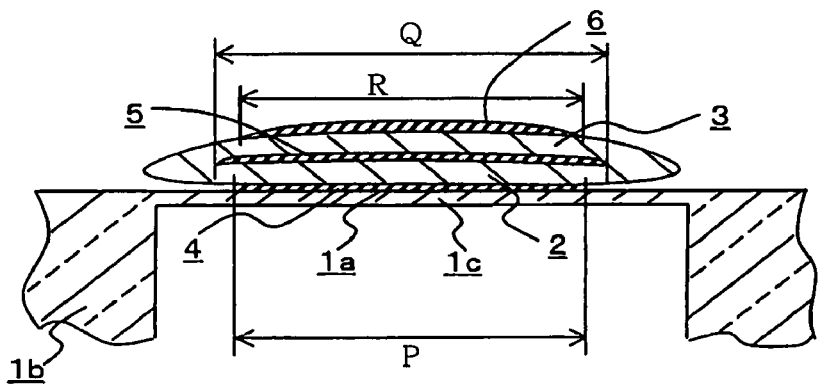
FIG. 10 is a cross-sectional view showing another detailed example of the embodiment shown in FIG. 2.
Figure 11:
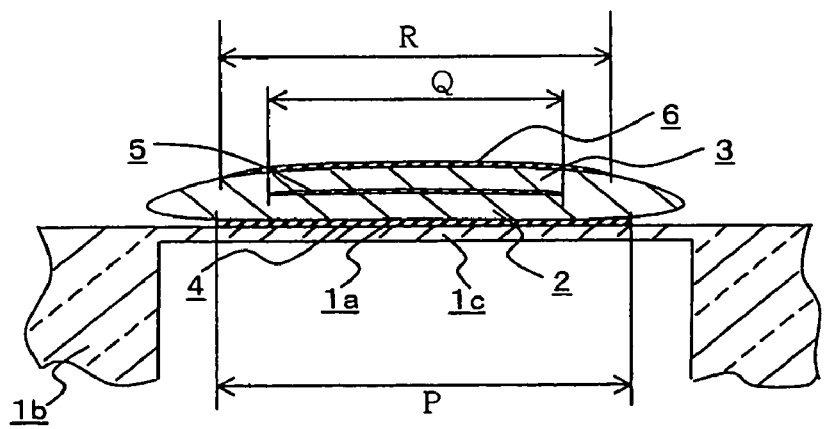
FIG. 11 is a cross-sectional view showing another detailed example of the embodiment shown in FIG. 2.

In the present invention, in the case of obtaining a large amount of bending displacement by increasing the drive voltage of the multilayered piezoelectric/electrostrictive device, the electrode 5 positioned in the middle layer is preferably formed in a greater range than the electrodes 4 and 6 positioned in the lower layer and the upper layer as shown in FIG. 10, or the electrode 5 positioned in the middle layer is preferably formed in a smaller range than the electrodes 4 and 6 positioned in the lower layer and the upper layer as shown in FIG. 11. These configurations prevent an electric field from being applied in the region near the end (in the lateral direction) in which the thickness of the piezoelectric/electrostrictive portions 2 and 3 tends to be decreased, whereby dielectric breakdown of the piezoelectric/electrostrictive portions 2 and 3 can be prevented. In the case where a difference in width is provided in the range in which the electrodes are formed, the difference in width is preferably optimized taking the electric field distribution into consideration. For example, the ratio of the electrode formation area (area of formation surface) of the electrodes 4 and 5 (or 5 and 6) adjacent with the piezoelectric/electrostrictive portion 2 (or 3) interposed therebetween is preferably 0.5–2, still more preferably 0.67–1.5, and particularly preferably 0.83–1.2. In FIGS. 9–11, the reference symbol P denotes the width of the lower electrode, the reference symbol Q denotes the width of the middle electrode, and the reference symbol R denotes the width of the upper electrode.

A method of manufacturing the multilayered piezoelectric/electrostrictive device of the present invention is described below. A piezoelectric/electrostrictive ceramic composition layer is formed on a ceramic substrate or an electrode is formed on the surface of the substrate. Methods for forming the electrode include an ion beam method, sputtering method, vacuum deposition method, PVD method, ion plating method, CVD method, plating method, screen printing method, spraying method, and dipping method. Of these, sputtering and screen printing are preferable from the viewpoint of providing bondability with the substrate and the piezoelectric/electrostrictive portion. The resulting electrode is integrated with the substrate and/or the piezoelectric/electrostrictive portion by a heat treatment at a temperature of about 1000–1400° C. The heat treatment may be performed each time an electrode is formed, or may be performed with the heat treatment step for the piezoelectric/electrostrictive ceramic composition layers.

The piezoelectric/electrostrictive ceramic composition may be prepared by sintering and grinding a mixed raw material in which the raw materials are mixed corresponding to the composition, or by adding NiO to a presintered mixed raw material and further presintering and grinding the mixed raw material. A method for preparing a piezoelectric/electrostrictive ceramic composition which comprises a $PbMg_{1/3}Nb_{2/3}O_3$—$PbZrO_3$—$PbTiO_3$ three-component solid solution composition as an essential component is described below in detail as a representative example.

A single element such as Pb, Mg, Nb, Zr, or Ti, an oxide of each element ($PbO$, $Pb_3O_4$, $MgO$, $Nb_2O_5$, $TiO_2$, or $ZrO_2$, or the like), carbonate ($MgCO_3$ or the like), or a compound containing a plurality of these elements ($MgNb_2O$ or the like) is mixed so that the content of each element becomes the composition ratio of a desired piezoelectric/electrostrictive ceramic composition to prepare a mixed raw material which is the essential component of the piezoelectric/electrostrictive ceramic composition.

The mixed raw material is presintered at a temperature of 750–1300° C. After the addition of a desired amount of NiO, the mixture is mixed and sintered at a temperature of 750–1300° C. to obtain a piezoelectric/electrostrictive ceramic composition. In the resulting piezoelectric/electrostrictive ceramic composition, the ratio of the diffraction intensity of the pyrochlore phase to the diffraction intensity of the perovskite phase measured by using an X-ray diffraction device is preferably 5% or less, and more preferably 2% or less.

The resulting piezoelectric/electrostrictive ceramic composition is ground using a conventional grinding device such as a ball mill, attritor, or bead mill to obtain a powder with a desired particle size. The average particle size of the piezoelectric/electrostrictive ceramic composition obtained by grinding is preferably in a range of 0.1–1.0 μm, and more preferably in a range of 0.3–0.7 μm. The particle size may be adjusted by subjecting the powder of the piezoelectric/electrostrictive ceramic composition obtained by grinding to a heat treatment at a temperature of 400–750° C. In this case, finer particles are integrated with other particles to form a powder with a uniform particle size, whereby a piezoelectric/electrostrictive portion with a uniform particle size can be obtained. The piezoelectric/electrostrictive ceramic composition may be prepared by using an alkoxide method or a coprecipitation method, for example.

The piezoelectric/electrostrictive ceramic composition which comprises a $Pb(Mg,Ni)_{1/3}Nb_{2/3}O_3$—$PbZrO_3$—$PbTiO_3$ three-component solid solution composition as an essential component is obtained in the same manner as the piezoelectric/electrostrictive ceramic composition which comprises a $PbMg_{1/3}Nb_{2/3}O_3$—$PbZrO_3$—$PbTiO_3$ three-component solid solution composition as an essential component, except for performing a step of presintering, at once, a mixed raw material prepared by mixing a single element such as Pb, Mg, Ni, Nb, Zr, or Ti, an oxide of each element ($PbO$, $Pb_3O_4$, $MgO$, $NiO$, $Nb_2O_5$, $TiO_2$, $ZrO_2$, or the like), carbonate ($MgCO_3$ or the like), or a compound containing a plurality of each element ($MgNb_2O$ or the like) so that the content of Pb, Mg, Ni, Nb, Zr, and Ti elements becomes the composition ratio of a desired piezoelectric/electrostrictive ceramic composition.

Examples of methods for forming a piezoelectric/electrostrictive ceramic composition layer on the substrate include a screen printing method, spraying method, or dipping method. Of these, it is preferable to use screen printing since the layers can be continuously and easily formed in a highly accurate shape and thickness. An electrode is formed on the piezoelectric/electrostrictive ceramic composition layer formed on the surface of the substrate by using the above-described method. Piezoelectric/electrostrictive ceramic composition layers and electrodes are alternately and repeatedly formed on the electrode until the desired multilayered structure is obtained.

A layered product obtained by alternately layering the piezoelectric/electrostrictive ceramic composition layers and the electrodes on the surface of the substrate is integrally heated. This heat treatment causes the piezoelectric/electrostrictive portion formed of the piezoelectric/electrostrictive ceramic formed of the piezoelectric/electrostrictive ceramic composition to adhere to the substrate directly or through the electrode. The heat treatment is not necessarily performed integrally. The heat treatment may be performed each time a piezoelectric/electrostrictive ceramic composition layer is formed. However, it is preferable to integrally perform the heat treatment step when the electrode is formed from the viewpoint of production efficiency.

The heat treatment temperature is preferably in a range of 1000–1400° C., and more preferably in a range of 1100–1350° C. If the heat treatment temperature is less than 1000° C., the piezoelectric/electrostrictive portion may not sufficiently adhere to the substrate or the electrode, or the density of the piezoelectric/electrostrictive portion may not be adequate. If the heat treatment temperature exceeds 1400° C., since the volatilization amount of Pb and Ni in the piezoelectric/electrostrictive ceramic composition increases, it is difficult to form a piezoelectric/electrostrictive portion with the desired composition. The maximum temperature retention or hold time during the heat treatment step is preferably in a range of 10 minutes to 10 hours, and more preferably in a range of 20 minutes to four hours. If the maximum temperature retention time is less than 10 minutes, densification of the piezoelectric/electrostrictive portion tends to be inadequate, whereby the desired characteristics may not be obtained. If the maximum temperature retention time exceeds 10 hours, the total volatilization amount of Pb and Ni increases even if the atmosphere is controlled, whereby the piezoelectric/electrostrictive characteristics may decrease or dielectric breakdown increases.

In order to form a piezoelectric/electrostrictive portion so that the Ni content in the piezoelectric/electrostrictive ceramic composition is controlled in a desired amount, it is preferable to perform the heat treatment step in the presence of an atmosphere control material having an Ni content that is approximately the same as the Ni content in the piezoelectric/electrostrictive ceramic composition. It is preferable that the content of the other materials in the atmosphere control materials is approximately the same as that of the piezoelectric/electrostrictive ceramic composition in order to prevent volatilization of the other components and to securely obtain a piezoelectric/electrostrictive portion having the desired composition.

A polarization treatment is performed under suitable conditions. In this case, it is preferable to perform the polarization treatment by heating in the same manner as in a conventional method. The heating temperature is preferably 40–200° C., although the heating temperature varies depending on the Curie point of the piezoelectric/electrostrictive ceramic.

EXAMPLES

The present invention is further described below in more detail by way of examples. However, the present invention is not limited to the following examples.

Examples 1–5 and Comparative Examples 1–4

A necessary number of Pt electrodes 4 (surface area of 0.4 mm×3 mm with thickness of 5 μm) were formed using a screen printing method on a substrate 1 formed of $ZrO_2$ stabilized by $Y_2O_3$ and having a shape shown in FIGS. 5(a) to 5(c) (thin portion 1c: 0.8×4 mm (dimensions)×100 μm (thickness)) which was formed by using a green sheet forming method and sintered. Each of the electrodes 4 was integrated with the substrate 1 (thin portion 1c) by a heat treatment at a temperature of 1300° C. for two hours.

By using a piezoelectric/electrostrictive ceramic composition having the compositional formula and the Ni content (mass %) shown in Table 1, a first piezoelectric/electrostrictive portion 12 having a surface area of 0.6 mm×2.8 mm with a thickness of 15 μm was formed by screen printing on each of the electrodes 4 that had been previously integrated with the substrate 1. Each of the Pt electrodes 5 (surface area of 0.8 mm×4 mm with thickness of 5 μm) was formed on each of the resulting products by screen printing. By using a piezoelectric/electrostrictive ceramic composition having the compositional formula and the Ni content (mass %) shown in Table 1, each of the second piezoelectric/electrostrictive portions 13 (surface area of 0.6 mm×2.8 mm with thickness of 15 μm) was formed on the thus formed respective electrodes 5 by screen printing. The "Ni content ratio (first/second)" shown in Table 1 is a value given by the ratio of the Ni content (mass %) in each piezoelectric/electrostrictive ceramic composition used for forming the first piezoelectric/electrostrictive portion 12 to the Ni content (mass %) in each piezoelectric/electrostrictive ceramic composition used for forming the second piezoelectric/electrostrictive portion 13.

Each of the thus formed products was subjected to a heat treatment at a temperature of 1275° C. for two hours in a container in the presence of an atmosphere control material having the same composition as that of the piezoelectric/electrostrictive ceramic composition used for forming the second piezoelectric/electrostrictive portion 13 in an NiO conversion amount of 0.002 mg/cm$^3$ per unit volume of atmosphere. An Au electrode 6 (surface area of 0.4 mm×4 mm with thickness of 5 μm) was formed on the thus treated product by screen printing. Each of the resulting products were subjected to a heat treatment to obtain a multilayered piezoelectric/electrostrictive device (Examples 1–5 and Comparative Examples 1–4) as shown in FIGS. 5(a) to 5(c).

line was employed as the particle size of the particle. The particle sizes of 100 particles of the piezoelectric/electros-

TABLE 1

| | | Piezoelectric/electrostrictive ceramic composition shown by Compositional formula | Ni content (mass %) | Ni content ratio (first/second) |
|---|---|---|---|---|
| Comparative Example 1 | First piezoelectric/ electrostrictive portion | $Pb_{1.00}\{(Mg_{0.87}Ni_{0.13})_{1/3}Nb_{2/3}\}_{0.20}Ti_{0.43}Zr_{0.37}O_3$ | 0.2 | 2.0 |
| | Second piezoelectric/ electrostrictive portion | $Pb_{1.00}\{(Mg_{0.935}Ni_{0.065})_{1/3}Nb_{2/3}\}_{0.20}Ti_{0.43}Zr_{0.37}O_3$ | 0.1 | |
| Comparative Example 2 | First piezoelectric electrostrictive portion | $Pb_{1.00}\{(Mg_{0.967}Ni_{0.033})_{1/3}Nb_{2/3}\}_{0.20}Ti_{0.43}Zr_{0.37}O_3$ | 0.05 | 1.0 |
| | Second piezoelectric/ electrostrictive portion | $Pb_{1.00}\{(Mg_{0.967}Ni_{0.033})_{1/3}Nb_{2/3}\}_{0.20}Ti_{0.43}Zr_{0.37}O_3$ | 0.05 | |
| Example 1 | First piezoelectric/ electrostrictive portion | $Pb_{1.00}\{(Mg_{0.87}Ni_{0.13})_{1/3}Nb_{2/3}\}_{0.20}Ti_{0.43}Zr_{0.37}O_3$ | 0.2 | 0.3 |
| | Second piezoelectric/ electrostrictive portion | $Pb_{1.00}\{(Mg_{0.543}Ni_{0.457})_{1/3}Nb_{2/3}\}_{0.20}Ti_{0.43}Zr_{0.37}O_3$ | 0.7 | |
| Example 2 | First piezoelectric/ electrostrictive portion | $Pb_{1.00}\{(Mg_{0.87}Ni_{0.13})_{1/3}Nb_{2/3}\}_{0.20}Ti_{0.43}Zr_{0.37}O_3$ | 0.2 | 0.2 |
| | Second piezoelectric/ electrostrictive portion | $Pb_{1.00}\{(Mg_{1/3}Nb_{2/3})_{0.20}Ti_{0.43}Zr_{0.37}O_3 + NiO$ | 1.0 | |
| Example 3 | First piezoelectric/ electrostrictive portion | $Pb_{1.00}\{(Mg_{0.87}Ni_{0.13})_{1/3}Nb_{2/3}\}_{0.20}Ti_{0.43}Zr_{0.37}O_3$ | 0.2 | 1.0 |
| | Second piezoelectric/ electrostrictive portion | $Pb_{1.00}\{(Mg_{0.87}Ni_{0.13})_{1/3}Nb_{2/3}\}_{0.20}Ti_{0.43}Zr_{0.37}O_3$ | 0.2 | |
| Example 4 | First piezoelectric/ electrostrictive portion | $Pb_{1.00}\{(Mg_{0.935}Ni_{0.065})_{1/3}Nb_{2/3}\}_{0.20}Ti_{0.43}Zr_{0.37}O_3$ | 0.1 | 0.5 |
| | Second piezoelectric/ electrostrictive portion | $Pb_{1.00}\{(Mg_{0.87}Ni_{0.13})_{1/3}Nb_{2/3}\}_{0.20}Ti_{0.43}Zr_{0.37}O_3$ | 0.2 | |
| Example 5 | First piezoelectric/ electrostrictive portion | $Pb_{1.00}\{(Mg_{0.478}Ni_{0.522})_{1/3}Nb_{2/3}\}_{0.20}Ti_{0.43}Zr_{0.37}O_3$ | 0.8 | 1.0 |
| | Second piezoelectric/ electrostrictive portion | $Pb_{1.00}\{(Mg_{0.478}Ni_{0.522})_{1/3}Nb_{2/3}\}_{0.20}Ti_{0.43}Zr_{0.37}O_3$ | 0.8 | |
| Comparative Example 3 | First piezoelectric/ electrostrictive portion | $Pb_{1.00}\{(Mg_{0.87}Ni_{0.13})_{1/3}Nb_{2/3}\}_{0.20}Ti_{0.43}Zr_{0.37}O_3$ | 0.2 | 0.1 |
| | Second piezoelectric/ electrostrictive portion | $Pb_{1.00}\{(Mg_{1/3}Nb_{2/3})_{0.20}Ti_{0.43}Zr_{0.37}O_3 + NiO$ | 1.5 | |
| Comparative Example 4 | First piezoelectric/ electrostrictive portion | $Pb_{1.00}\{(Mg_{0.347}Ni_{0.653})_{1/3}Nb_{2/3}\}_{0.20}Ti_{0.43}Zr_{0.37}O_3$ | 1.0 | 1.0 |
| | Second piezoelectric/ electrostrictive portion | $Pb_{1.00}\{(Mg_{0.347}Ni_{0.653})_{1/3}Nb_{2/3}\}_{0.20}Ti_{0.43}Zr_{0.37}O_3$ | 1.0 | |

The thickness (μm) of each of the first piezoelectric/electrostrictive portions 12 and the second piezoelectric/electrostrictive portions 13 of each multilayered piezoelectric/electrostrictive devices, and the maximum particle size (μm) and the average particle size (μm) of the piezoelectric/electrostrictive ceramic used for forming the piezoelectric/electrostrictive portion were measured. The α ratio was calculated therefrom. The bending displacement (μm) of each multilayered piezoelectric/electrostrictive device was measured. The results are shown in Table 2. The methods for measuring the average particle size and the maximum particle size of the piezoelectric/electrostrictive ceramic, the thickness of the piezoelectric/electrostrictive portion, and the bending displacement are given below.

Method for Measuring Average Particle Size and Maximum Particle Size

The average particle size and the maximum particle size of the piezoelectric/electrostrictive ceramic used for forming the piezoelectric/electrostrictive portion were measured by observing the cross section of the piezoelectric/electrostrictive portion in the layering direction using a scanning electron microscope. In more detail, a straight line was drawn on an arbitrary observed image (cross section of the piezoelectric/electrostrictive portion), and the distance between the grain boundaries of each particle of the piezoelectric/electrostrictive ceramic which crossed the straight line was employed as the particle size of the particle. The particle sizes of 100 particles of the piezoelectric/electrostrictive ceramic were measured to calculate the average particle size and the maximum particle size.

Method for Measuring the Thickness of the Piezoelectric/Electrostrictive Portion The thickness of the piezoelectric/electrostrictive portion was measured by observing the cross section of the piezoelectric/electrostrictive portion in the layering direction using a scanning electron microscope. In more detail, the thickness of the piezoelectric/electrostrictive portion was measured at three points including the center and both ends of the cross section of the multilayered piezoelectric/electrostrictive device, and the average value of the thicknesses at the three points was employed as the thickness (μm) of the piezoelectric/electrostrictive portion. The ends of the cross section of the multilayered piezoelectric/electrostrictive device are ends of a portion which substantially exhibits characteristics of each piezoelectric/electrostrictive portion held between the electrodes. Specifically, the right end in FIG. 5(b) is a portion near the end of the middle electrode 5, and the left end is a portion near the ends of the upper electrode 6 and the lower electrode 4.

Method for Measuring the Bending Displacement

The bending displacement (μm) was measured using a laser displacement measurement device by applying a voltage between the upper and lower electrodes so that an electric field of 50 V/mm occurs. In Table 2, the "average"

of the bending displacement (μm) is the average value in the case of manufacturing the multilayered piezoelectric/electrostrictive devices of the examples and the comparative examples, ten pieces each, and measuring the bending displacement at the end (actuator portion 30 (see FIG. 5(*b*))). The "variation" is the difference between the maximum value and the minimum value of the measured bending displacement.

TABLE 2

| | | Piezoelectric/ electrostrictive ceramic | | Thickness of piezoelectric/ Electrostrictive portion (μm) | Ratio α | Bending displacement (μm) | |
| --- | --- | --- | --- | --- | --- | --- | --- |
| | | Maximum particle size (μm) | Average particle size (μm) | | | Average | Variation |
| Comparative Example 1 | First piezoelectric/ electrostrictive portion | 1.5 | 0.2 | 11.2 | 0.01 | 2.92 | 0.30 |
| | Second piezoelectric/ electrostrictive portion | 1.6 | 0.2 | 11.4 | 0.02 | | |
| Comparative Example 2 | First piezoelectric/ electrostrictive portion | 0.9 | 0.15 | 10.5 | 0.01 | 2.00 | 0.25 |
| | Second piezoelectric/ electrostrictive portion | 0.8 | 0.13 | 10.8 | 0.01 | | |
| Example 1 | First piezoelectric/ electrostrictive portion | 6.8 | 4.2 | 10.5 | 0.40 | 3.50 | 0.70 |
| | Second piezoelectric/ electrostrictive portion | 7.0 | 4.2 | 10.8 | 0.39 | | |
| Example 2 | First piezoelectric/ electrostrictive portion | 5.6 | 3.2 | 10.3 | 0.31 | 3.65 | 1.02 |
| | Second piezoelectric/ electrostrictive portion | 5.8 | 3.1 | 10.1 | 0.31 | | |
| Example 3 | First piezoelectric/ electrostrictive portion | 4.1 | 2.0 | 9.9 | 0.20 | 3.92 | 0.39 |
| | Second piezoelectric/ electrostrictive portion | 4.2 | 2.1 | 10.1 | 0.21 | | |
| Example 4 | First piezoelectric/ electrostrictive portion | 2.0 | 0.3 | 9.4 | 0.03 | 3.12 | 0.35 |
| | Second piezoelectric/ electrostrictive portion | 2.4 | 0.4 | 10.3 | 0.04 | | |
| Example 5 | First piezoelectric/ electrostrictive portion | 9.5 | 6.4 | 11.4 | 0.56 | 3.75 | 1.20 |
| | Second piezoelectric/ electrostrictive portion | 8.8 | 5.7 | 10.9 | 0.52 | | |
| Comparative Example 3 | First piezoelectric/ electrostrictive portion | 10.3 | 6.4 | 10.0 | 0.64 | 3.82 | 1.72 |
| | Second piezoelectric/ electrostrictive portion | 10.1 | 6.5 | 9.8 | 0.66 | | |
| Comparative Example 4 | First piezoelectric/ electrostrictive portion | 10.8 | 7.4 | 10.5 | 0.70 | 3.85 | 1.85 |
| | Second piezoelectric/ electrostrictive portion | 10.2 | 6.7 | 9.9 | 0.68 | | |

As shown in the results shown in Table 2, it was 2, it was found that the multilayered piezoelectric/electrostrictive devices of Examples 1–5 exhibit sufficient bending displacement in comparison with the multilayered piezoelectric/electrostrictive devices of Comparative Examples 1–4, and also show little variation in the bending displacement. This is considered to be because the α ratio of every piezoelectric/electrostrictive portion constituting each of the multilayered piezoelectric/electrostrictive devices is within the predetermined range in case of the multilayered piezoelectric/electrostrictive devices in Examples 1–5.

As described above, since the ratio of the average particle size of the piezoelectric/electrostrictive ceramic used for forming the piezoelectric/electrostrictive portion to the thickness of the piezoelectric/electrostrictive portion satisfies the predetermined relationship in each piezoelectric/electrostrictive portion, the multilayered piezoelectric/electrostrictive device of the present invention includes a piezoelectric/electrostrictive portion having extremely excellent piezoelectric/electrostrictive characteristics. This device also provides excellent vibration transfer characteristics between the substrate and the piezoelectric/electrostrictive portion, shows little variation in the piezoelectric/electrostrictive characteristics between the multilayered piezoelectric/electrostrictive portions or even among portions of a single piezoelectric/electrostrictive portion, and also exhibits excellent durability. The multilayered piezoelectric/electrostrictive device of the present invention is suitable as a piezoelectric/electrostrictive device that can be used to form a transmitter, sensor, actuator, or the like by utilizing these characteristics.

What is claimed is:

1. A multilayered piezoelectric/electrostrictive device comprising:
   a ceramic substrate, a plurality of piezoelectric/electrostrictive portions comprising a piezoelectric/electrostrictive ceramic composition; and
   a plurality of electrodes electrically connected with the piezoelectric/electrostrictive portions;
   wherein the piezoelectric/electrostrictive portions and the electrodes are alternately layered on the substrate;

wherein a lowermost one of the piezoelectric/electrostrictive portions positioned in a lowermost piezoelectric/electrostrictive layer adheres to the substrate directly or through a lowermost one of the electrodes positioned in a lowermost electrode layer; and wherein a ratio ($\alpha=A/B$) of an average particle size (A) of the piezoelectric/electrostrictive ceramic of the piezoelectric/electrostrictive portion to a thickness (B) of the piezoelectric/electrostrictive portion is greater than 0.2 and not more than 0.4 in each of the piezoelectric/electrostrictive portions.

2. The multilayered piezoelectric/electrostrictive device according to claim 1, wherein a maximum particle size of the piezoelectric/electrostrictive ceramic of the piezoelectric/electrostrictive portions is smaller than the thickness of the piezoelectric/electrostrictive portion in each of the piezoelectric/electrostrictive portions.

3. The multilayered piezoelectric/electrostrictive device according to claim 1, wherein the piezoelectric/electrostrictive ceramic of the lowermost piezoelectric/electrostrictive portion has an Ni content (NiO conversion) in a range of 0.06–0.84 mass %; and wherein an Ni content (NiO conversion) in the piezoelectric/electrostrictive ceramic of each of the piezoelectric/electrostrictive portions positioned above the lowermost piezoelectric/electrostrictive portion is greater than or equal to the Ni content (NiO conversion) in the piezoelectric/electrostrictive ceramic of the lowermost piezoelectric/electrostrictive portion.

4. The multilayered piezoelectric/electrostrictive device according to claim 1, wherein the thickness of the piezoelectric/electrostrictive portions is in a range of 1–50 μm.

5. The multilayered piezoelectric/electrostrictive device according to claim 1, wherein the piezoelectric/electrostrictive ceramic comprises a $Pb(Mg,Ni)_{1/3}Nb_{2/3}O_3$—$PbZrO_3$—$PbTiO_3$ three-component solid solution composition as an essential component represented by the formula $Pb_x\{(Mg_{1-y}Ni_y)_{(1/3)\times a}Nb_{2/3}\}_b Ti_c Zr_d O_3$;

wherein $0.95 \leq x \leq 1.05$, $0.05 \leq y \leq 0.50$, $0.90 \leq a \leq 1.10$, and wherein each of b, c, and d is a decimal within a range enclosed by coordinates in which b, c, and d are axes of coordinates, (b, c, d)=(0.550, 0.425, 0.025), (0.550, 0.325, 0.125), (0.375, 0.325, 0.300), (0.100, 0.425, 0.475), (0.100, 0.475, 0.425), and (0.375, 0.425, 0.200), when (b+c+d) is equal to 1.000.

6. The multilayered piezoelectric/electrostrictive device according to claim 1, wherein the piezoelectric/electrostrictive ceramic of the lowermost piezoelectric/electrostrictive portion comprises a $Pb(Mg,Ni)_{1/3}Nb_{2/3}O_3$—$PbZrO_3$—$PbTiO_3$ three-component solid solution composition as an essential component represented by the formula $Pb_x\{(Mg_{1-y}Ni_y)_{(1/3)\times a}Nb_{2/3}\}_b Ti_c Zr_d O_3$;

wherein $0.95 \leq x \leq 1.05$, $0.05 \leq y \leq 0.50$, $0.90 \leq a \leq 1.10$, and wherein each of b, c, and d is a decimal within a range enclosed by coordinates in which b, c, and d are axes of coordinates, (b, c, d)=(0.550, 0.425, 0.025), (0.550, 0.325, 0.125), (0.375, 0.325, 0.300), (0.100, 0.425, 0.475), (0.100, 0.475, 0.425), and (0.375, 0.425, 0.200), when (b+c+d) is equal to 1.000; and wherein the piezoelectric/electrostrictive ceramic of the piezoelectric/electrostrictive portions positioned above the lowermost piezoelectric/electrostrictive portion comprises NiO and a $PbMg_{1/3}Nb_{2/3}O_3$—$PbZrO_3$—$PbTiO$ three-component solid solution composition as an essential component represented by the formula $Pb_x(Mg_{y/3}Nb_{2/3})_a Ti_b Zr_c O_3$;

wherein $0.95 \leq x \leq 1.05$, $0.95 \leq y \leq 1.050$, and wherein each of a, b, and c is a decimal in a range enclosed by coordinates in which b, c, and d are axes of coordinates, (a, b, c)=(0.550, 0.425, 0.025), (0.550, 0.325, 0.125), (0.375, 0.325, 0.300), (0.100, 0.425, 0.475), (0.100, 0.475, 0.425), and (0.375, 0.425, 0.200), when (a+b+c) is equal to 1.000.

* * * * *